United States Patent
Whittenburg et al.

(10) Patent No.: US 6,867,978 B2
(45) Date of Patent: Mar. 15, 2005

(54) INTEGRATED HEAT SPREADER PACKAGE FOR HEAT TRANSFER AND FOR BOND LINE THICKNESS CONTROL AND PROCESS OF MAKING

(75) Inventors: Kris J. Whittenburg, Tempe, AZ (US); Fay Hua, San Jose, CA (US); Carl L. Deppisch, Phoenix, AZ (US); Sabina J. Houle, Phoenix, AZ (US); Peter Brandenburger, Chandler, AZ (US); Kim L. Phillippe, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/266,996

(22) Filed: Oct. 8, 2002

(65) Prior Publication Data

US 2004/0066630 A1 Apr. 8, 2004

(51) Int. Cl.[7] .................................................. H05K 7/20
(52) U.S. Cl. ........................ 361/719; 361/714; 361/704; 257/713
(58) Field of Search .......................... 361/688, 704–714, 361/717–719; 257/706, 717, 712, 713, 720, E23.083, E23.101, E23.102; 438/122

(56) References Cited

U.S. PATENT DOCUMENTS

| 4,811,166 | A | * | 3/1989 | Alvarez et al. .............. 361/717 |
| 5,050,040 | A | * | 9/1991 | Gondusky et al. ........... 361/708 |
| 5,901,446 | A | * | 5/1999 | Szymansky ................. 30/43.92 |
| 6,114,005 | A | * | 9/2000 | Nagai et al. ................. 428/114 |
| 2002/0000239 | A1 | * | 1/2002 | Sachdev et al. | |
| 2003/0117775 | A1 | * | 6/2003 | Vrtis et al. | |

* cited by examiner

Primary Examiner—Anatoly Vortman
(74) Attorney, Agent, or Firm—Schwegman, Lundberg, Woessner & Kluth, P.A.

(57) ABSTRACT

A system includes a thermal interface material (TIM) to transfer heat from a die to a heat spreader. The system includes a heat transfer subsystem disposed on the backside surface of the die. In one embodiment, the heat transfer subsystem comprises a first heat transfer material and a second heat transfer material discretely disposed within the first heat transfer material. A method of bonding a die to a heat spreader uses a die-referenced process as opposed to a substrate-referenced process.

14 Claims, 4 Drawing Sheets

INTEGRATED HEAT SPREADER PACKAGE FOR HEAT TRANSFER AND FOR BOND LINE THICKNESS CONTROL AND PROCESS OF MAKING

TECHNICAL FIELD

Embodiments of the present invention relate to an integrated heat spreader as it is bonded to a die. The bond includes a high-temperature bump or other structure that is discretely intermingled with a lower-temperature material.

BACKGROUND INFORMATION

Description of Related Art

One of the issues encountered when using an integrated heat spreader (IHS) is getting a balance between sufficient adhesion to the die, and a high enough heat flow to meet the cooling load of the die. To deal with this issue, different bonding materials have been tried with varying results. If the adhesion is insufficient, the IHS may spall off from the thermal interface material (TIM) and result in a yield issue or a field failure. Another issue encountered is achieving an acceptable IHS standoff from the die and the board to which the board is mounted. Because of various existing processes, a substrate-referenced process is used that may cause a significant variation in bond-line thickness (BLT) between the top of the die and the bonding surface of the IHS.

TIM BLT is maintained for mechanical reliability of the thermal interface during thermal cycling. Due to the difference in the coefficients of thermal expansion of the IHS and the die, there is a large amount of shear stress imposed on the TIM. Thicker bond lines assist the TIM to withstand these high stresses without failing.

TIM BLT is also an element in the thermal resistance of the thermal interface. A thinner TIM BLT can result in a lower thermal resistance. Due to these limits in TIM BLT, which can be required for acceptable package performance, TIM BLT must be tightly controlled.

BRIEF DESCRIPTION OF THE DRAWINGS

In order to understand the manner in which embodiments of the present invention are obtained, a more particular description of various embodiments of the invention briefly described above will be rendered by reference to the appended drawings. Understanding that these drawings depict only typical embodiments of the invention that are not necessarily drawn to scale and are not therefore to be considered to be limiting of its scope, the embodiments of the invention will be described and explained with additional specificity and detail through the use of the accompanying drawings in which.

DETAILED DESCRIPTION

One embodiment of the present invention relates to a system that includes a thermal interface material (TIM) intermediary between a heat spreader and a die for heat transfer out of the die. One embodiment includes a method of bonding a die to a heat spreader that uses a die-referenced process as opposed to a substrate-referenced process.

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structures of embodiments most clearly, the drawings included herein are diagrammatic representations of inventive articles. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
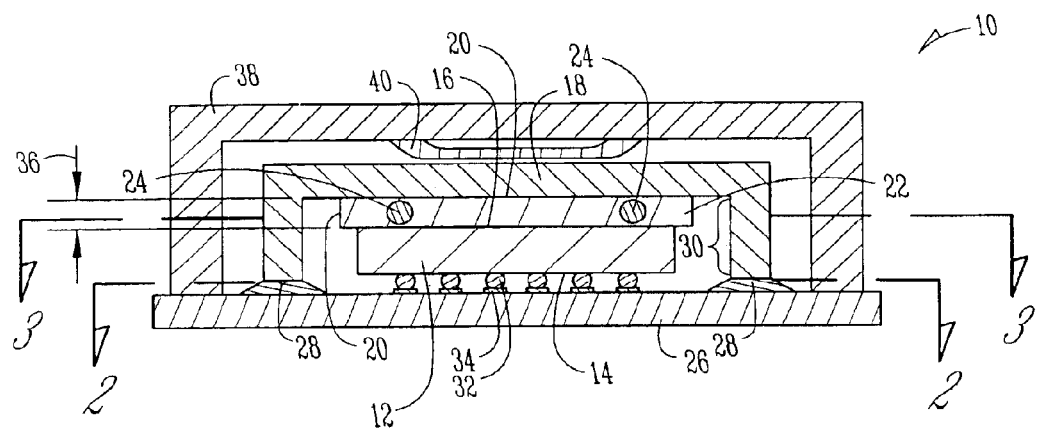
FIG. 1 is an elevational cross-section of a package according to an embodiment.

FIG. 1 is an elevational cross-section of a packaging system 10 according to an embodiment. The packaging system 10 includes a die 12 with an active surface 14 and a backside surface 16. The die 12 is connected to a thermal management device. In one embodiment, the thermal management device is integrated heat spreader 18 that is disposed above the backside surface 16 of the die 12. An interface subsystem 20, in the form of a TIM, is disposed between a backside surface 16 and the integrated heat spreader 18. The interface subsystem 20 includes a first heat transfer material 22 and a second heat transfer material 24 that is discretely disposed within the first heat transfer material 22. In one embodiment, the second heat transfer material 24 has a higher thermal conductivity that the first heat transfer material 22.

In one embodiment where the two heat transfer materials are metals, the second heat transfer material 24 has a higher melting point than the first heat transfer material 22. In one embodiment where the first heat transfer material is an organic, the second heat transfer material 24 has a melting point that is higher than the curing temperature of the first heat transfer material 22.

In another embodiment, the first heat transfer material 22 in an organic-inorganic composite. The organic-inorganic composite in one embodiment includes a polymer, optionally an inorganic dielectric, and optionally at least one metallic. The inorganic dielectric may be a material as is used as filler in thermal interface structures. One embodiment of an inorganic dielectric is fused silica and the like. Where a metallic material is used as a portion of an organic-inorganic composite, the metallic material in one embodiment is a low melting-point solder or the like.

As depicted in FIG. 1, the interface subsystem 20 is depicted as having a low melting-point solder first heat transfer material 22 having a first melting point and a high melting-point solder second heat transfer material 24 that is discretely disposed within the first heat transfer material 22 and having a second melting point that is higher than that of the first melting point. In one embodiment, the packaging system 10 includes a second heat transfer material 24 that is at least one solder island that is discretely disposed within the first heat transfer material 22.

In one embodiment, a reactive solder system is used. A reactive solder material includes properties that allow for adhesive and/or heat-transfer qualities. For example, the reactive solder material can melt and resolidify without a pre-flux cleaning that was previously required. Further, a reactive solder embodiment can also include bonding without a metal surface. Without the need of a metal surface for bonding, processing can be simplified.

In one embodiment, a reactive solder includes a base solder that is alloyed with an active element material. In one embodiment, a base solder is indium. In one embodiment, a base solder is tin. In one embodiment, a base solder is silver. In one embodiment, a base solder is tin-silver. In one embodiment, a base solder is at least one lower-melting-point metal with any of the above base solders. In one embodiment, a base solder is a combination of at least two of the above base solders. Additionally, conventional lower-melting-point metals/alloys can be used.

The active element material is alloyed with the base solder. In one embodiment, the active element material is provided in a range from about 2% to about 30% of the total solder. In one embodiment, the active element material is provided in a range from about 2% to about 10%. In one embodiment, the active element material is provided in a range from about 0.1% to about 2%.

Various elements can be used as the active element material. In one embodiment, the active element material is selected from hafnium, cerium, lutetium, other rare earth elements, and combinations thereof. In one embodiment, the active element material is a refractory metal selected from titanium, tantalum, niobium, and combinations thereof. In one embodiment, the active element material is a transition metal selected from nickel, cobalt, palladium, and combinations thereof. In one embodiment, the active element material is selected from copper, iron, and combinations thereof. In one embodiment, the active element material is selected from magnesium, strontium, cadmium, and combinations thereof.

The active element material when alloyed with the base solder can cause the alloy to become reactive with a semi-conductive material such as the backside surface 16 of the die 12. The alloy can also become reactive with an oxide layer of a semiconductive material such as silicon oxide, gallium arsenide oxide, and the like. The alloy can also become reactive with a nitride layer of a semiconductive material such as silicon nitride, silicon oxynitride, gallium arsenide nitride, gallium arsenide oxynitride, and the like.

Reaction of the alloy with the die 12 can be carried out by thermal processing. Heat can be applied by conventional processes, such that the active element materials reach the melting zone of the base solder. For example, where the base solder includes indium, heating is carried out in a range from about 150° C. to about 200° C.

During reflow of the alloy, the active element(s) dissolve and migrate to the backside surface 16 of the die 12. Simultaneously, the base solder bonds to the integrated heat spreader 18. It is not necessary that the backside surface 16 be metalized prior to soldering. The solder joint (not depicted) that is formed by the reactive solder material can display a bond strength in a range from about 1,000 psi and about 2,000 psi.

Figure 2:
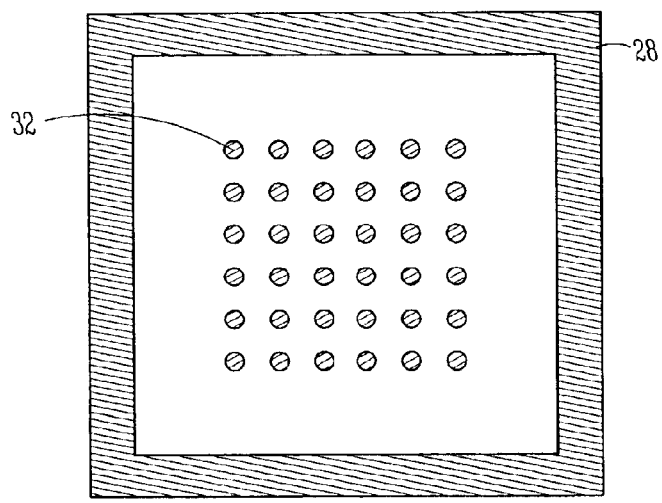
FIG. 2 is a partial cut-away cross-sectional view of the packaging system depicted in FIG. 1 taken along the section line 2—2.

FIG. 2 is a partial cut-away cross-sectional view of the packaging system 10 taken along the section line 2–2'. It is noted that in FIG. 1, the integrated heat spreader 18 is attached to a mounting substrate 26 such as a printed circuit board (PCB), such as a main board, a motherboard, a mezzanine board, an expansion card, or another mounting substrate, with a bonding material 28 that secures a lip portion 30 of the integrated heat spreader 18 thereto. In one embodiment, the thermal management device is a heat sink without a lip structure such as a simple planar heat sink. In one embodiment the thermal management device includes a heat pipe configuration. It is noted in FIG. 1 that the die 12 is disposed between the interface subsystem 20 and a series of electrical bumps 32 that are in turn each mounted on a series of bond pads 34. The electrical bumps 32 make contact with the active surface 14 of the die 12. Contrariwise, the interface subsystem 20 makes thermal contact with the backside surface 16 of the die 12.

As taken along the section line 2–2', FIG. 2 illustrates a cross-section of the bonding material 28 that fastens a lip portion 30 (FIG. 1) of the integrated heat spreader 18 (FIG. 1) to the mounting substrate 26 (FIG. 1). Additionally, the electrical bumps 32 are depicted in a ball grid array as is known in the art.

Figure 3:
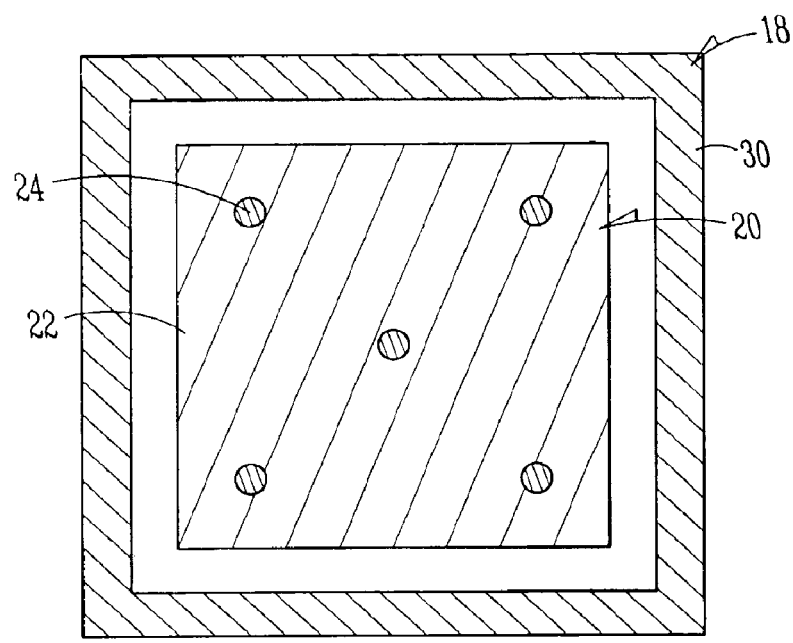
FIG. 3 is a cut-away cross-sectional view of a portion of the packaging system depicted in FIG. 1 taken along the section line 3—3.

FIG. 3 is a cut-away cross-sectional view of a portion of the packaging system 10 depicted in FIG. 1 taken along the section line 3–3'. It can be seen in FIG. 3, that the lip portion 30 of the integrated heat spreader 18 is exposed in this view. Additionally, FIG. 3 depicts a cross-section of the interface subsystem 20, which includes a pattern of solder islands that are the second heat transfer material 24 and that are discretely disposed within the first heat transfer material 22. Although the pattern of solder islands in the second heat transfer material 24 is depicted as a five-element grouping, patterning according to various embodiments includes a single solder island, two solder islands, three solder islands that are either linearly arranged or otherwise, and multiple solder islands that are arrayed according to the needs of a given application of an embodiment.

According to an embodiment, the heat transfer materials include solder. The solder may contain lead (Pb) or be a substantially Pb-free solder. By "substantially Pb-free solder", it is meant that the solder is not designed with Pb content according to industry trends. A substantially Pb-free solder in one embodiment includes an SnAgCu solder as is known in the art.

One example of a Pb-containing solder includes a tin-lead solder. In selected embodiments, Pb-containing solder is a tin-lead solder composition such as from 97% tin (Sn)/3% lead (Sn3Pb). A tin-lead solder composition that may be used as the first heat transfer material 22 or as the second heat transfer material 24 is a Sn63Pb composition of 37% tin/63% lead. In any event, the Pb-containing solder may be a tin-lead solder comprising $Sn_xPb_y$, wherein x+y total 1, and wherein x is in a range from about 0.3 to about 0.99. In one embodiment, the Pb-containing solder is a tin-lead solder composition of Sn3Pb for the first heat transfer material 22, and for the second heat transfer material 24, it is a tin-lead solder composition of Sn63Pb.

The following discussion refers specifically to structures depicted in FIGS. 1–3, but it applies generally to embodiments set forth herein. In one embodiment, the first heat transfer material 22 includes a Pb-containing solder, and the second heat transfer material 24 contains a Pb-containing solder that has a higher melting point than the first heat transfer material 22. In another embodiment, the first heat transfer material 22 includes a Pb-containing solder, and the second heat transfer material 24 contains a substantially Pb-free solder that has a higher melting point than the first heat transfer material 22. In another embodiment, the first heat transfer material 22 includes a substantially Pb-free solder, and the second heat transfer material 24 also contains a substantially Pb-free solder that has a higher melting point than the first heat transfer material 22. In another embodiment, the first heat transfer material 22 includes a substantially Pb-free solder, and the second heat transfer material 24 includes a Pb-containing solder that has a higher melting point than the first heat transfer material 22.

In one embodiment, the solder islands are arranged in an elongate, rectangular configuration that may follow the outline of a rectangular die, as will now be discussed with reference to FIG. 4.

Figure 4:
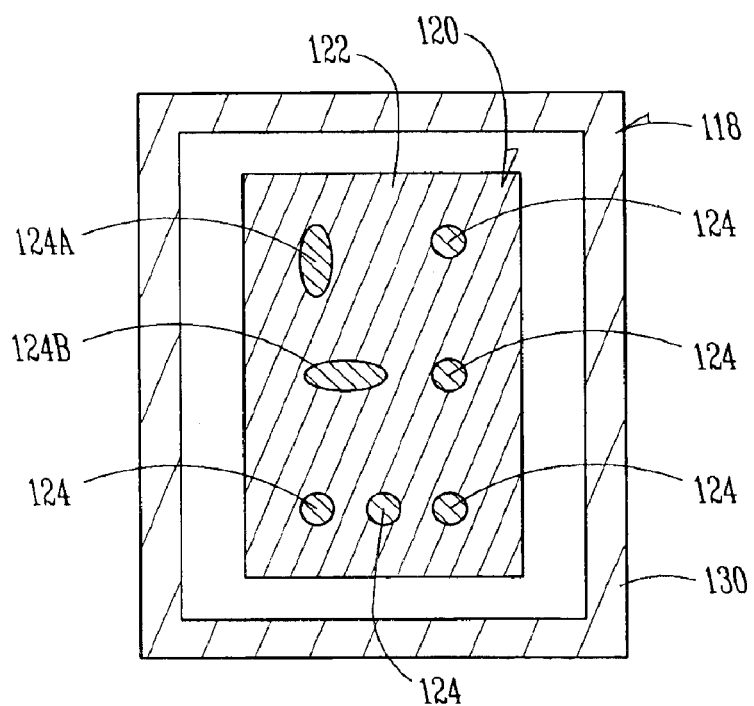
FIG. 4 is a cutaway cross-sectional view of a portion of an elongate, rectangular package according to an embodiment.

FIG. 4 is a cut-away cross-sectional view of a portion of an elongate, rectangular package according to an embodiment. FIG. 4 depicts the packaging system 110 that would be taken along a section line similar to the section line 3–3' from FIG. 1 and is analogous in its view to the view taken in FIG. 3. In this embodiment, an elongate, rectangular die heat spreader 118 has a symmetry to match an elongate, rectangular die (not pictured). The elongate, rectangular die is bonded to a likewise elongate, rectangular interface subsystem 120. It is noted that a collection of solder islands, such as depicted in FIG. 3, includes solder islands 124, 124A, and 124B of varying sizes and orientations of larger and smaller discrete occurrences of the second heat transfer material 24. The varying sizes and orientations of larger and smaller discrete occurrences of the second heat transfer material 24 are depicted in FIG. 3 in arbitrary number, shape, size, and location. As is noted, there are larger solder islands that are selected to be disposed adjacent to a die at the more active regions thereof. By way of non-limiting example, a given solder island 124B that is larger is disposed directly above a more active region of the die 112 (not pictured) such as an array of embedded dynamic random access memory (DRAM), the sense amplifiers thereof, and the like. A more active region of a die is understood to be, in one embodiment, a region that generates a greater amount of heat than the average per area heat generation. By placing a larger solder island above the die at a more active region, a larger solder island acts as a heat transfer conduit that has a higher overall heat transfer coefficient than the heat transfer capability of a smaller solder island, or, for that matter, the first heat transfer material 122 alone. This larger heat transfer capability represents a lowered resistance to heat flow between the heat-generating die and the heat-sinking heat spreader 118. In one embodiment, the heat spreader 118 includes a lip portion 130 similar to the embodiment depicted in FIGS. 1 and 3.

Figure 5:
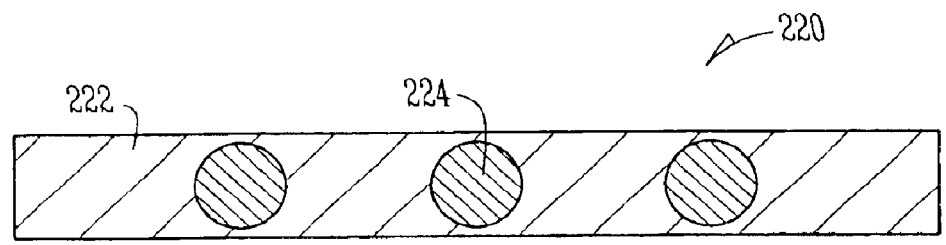
FIG. 5 is a cross-sectional view of an interface subsystem according to an embodiment.

FIG. 5 is a cross-sectional view of an interface subsystem 220 according to an embodiment. The interface subsystem 220 of FIG. 5 is similar to the interface subsystem 20 that is depicted in FIG. 1. According to various embodiments, the interface subsystem 220 is a combination of a low melting-point solder first heat transfer material 222 and a higher melting-point solder second heat transfer material 224. As set forth herein, the two heat transfer materials are selected from a combination of a Pb-containing solder and a substantially Pb-free solder. In another embodiment, the interface subsystem 220 includes an organic first heat transfer material 222 and a metallic second heat transfer material 224. As set forth herein, the first heat transfer material 222 has a first cure temperature that is lower than the melting point of the second heat transfer material 224. Similar to other embodiments as set forth herein, the placement of second heat transfer material 224 as discrete occurrences thereof may be located above a more active region of a die in order to expedite heat transfer away from the die.

Figure 6:
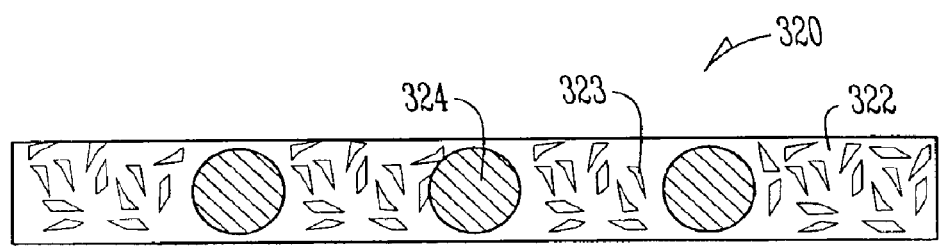
FIG. 6 is a cross-sectional view of an interface subsystem according to an embodiment.

FIG. 6 is a cross-sectional view of an interface system 320 according to an embodiment. Interface subsystem 320 includes an organic/inorganic composite. In one embodiment, the organic/inorganic composite includes an organic matrix 322 and a metal flake 323 along with a second heat transfer material 324. Although the metal flake 323 is depicted in this embodiment as a flake, the metal may be in other shapes. In one embodiment, the metal flake 323 is a substantially spherical powder that has an average diameter in a range from about 0.1 micron to about 10 micron. The second heat transfer material 324, which is in one embodiment a high melting-point solder, is either a Pb-containing solder or a substantially Pb-free solder as set forth herein.

Figure 7:
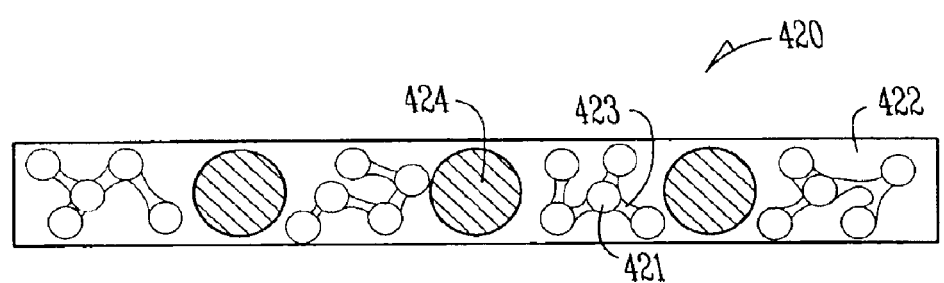
FIG. 7 is a cross-sectional view of an interface subsystem according to an embodiment.

FIG. 7 is a cross-sectional view of an interface subsystem 420 according to an embodiment. The interface subsystem 420 includes a metal/nonmetal composite in an organic matrix 422. In one embodiment, the organic matrix 422 includes an organic material that acts as a matrix for an inorganic dielectric material 421 and a metallic material 423. In this embodiment, the metallic material 423 is depicted as having reflowed under a thermal load and has at least partially wetted the inorganic dielectric material 421. The combination of the inorganic dielectric material 421 and the metallic material 423 presents a conglomerate channel from one surface of the interface subsystem 420 to an opposite surface thereof. As such, heat transfer through the organic matrix material 422 is expedited. Similarly, a high melting-point solder is depicted in an embodiment as the second heat transfer material 424.

Another embodiment relates to a die system. An embodiment of the die system is depicted in some of the structures illustrated in FIG. 1 by way of non-limiting example. With reference to FIG. 1, in one embodiment, the die system includes the die 12 and the interface subsystem 20 as set forth herein according to the various embodiments. Further, the die system in one embodiment includes the interface subsystem 20 that is the first heat transfer material 22 alone. In another embodiment, the die system includes the interface subsystem 20 with the first heat transfer material 22 and the second heat transfer material 24 disposed in the first heat transfer material 22. In another embodiment, the die system includes the second heat transfer material 24 alone that has a discrete patterning upon the die backside surface 16. The discrete patterning of the second heat transfer material 24 alone, upon the die backside surface 16, is a subset embodiment of the packaging system 10, as depicted in FIG. 1, wherein the discrete patterning upon the die 12 may be produced by a distinct business entity. For example, the heat spreader may be produced by a first company or division within a company, and the die with discrete patterning may be produced by a second company or division.

The die system in another embodiment includes the mounting substrate 26 disposed below the die 12. In other words, the die 12, the electrical bumps 32, and their bond pads 34 as mounted upon the mounting substrate 26, represent a package precursor according to this embodiment. In another embodiment, the die system includes the mounting substrate 26 and other structures as set forth herein and the integrated heat spreader 18 disposed above the die 12. As depicted in FIG. 1, the interface subsystem 20 is disposed between to the die 12 and the integrated heat spreader 18.

Another embodiment relates to a thermal interface alone as depicted in FIG. 1 (interface subsystem 20), FIG. 5 (interface subsystem 220), FIG. 6 (interface subsystem 320), and FIG. 7 (interface subsystem 420). According to an embodiment, the high melting-point solder second heat transfer material 24 (FIG. 1, for example) has at least one solder island that has a characteristic thickness that is in a range from about 0.1 micron to about 25 micron. The characteristic thickness is selected to achieve a preferred bond line thickness (BLT) as is understood in the art. Referring to FIG. 1, the BLT 36 in this embodiment closely tracks the solder island characteristic thickness, and it is larger than the solder island characteristic thickness. In other words, the BLT 36 has substantially the same thickness as the interface subsystem 20. In one embodiment, the BLT 36 is in a range from about 1 mil to about 25 mils. In one embodiment, the BLT 36 is in a range from about 2 mils to about 10 mils. In another embodiment, the BLT 36 is in a range from about 10 mils to about 20 mils. In one embodiment, the BLT 36 of a polymer matrix-containing material is less than the BLT 36 of a metal matrix-containing material.

In another embodiment, the high melting-point solder second heat transfer material 24 (FIG. 1, for example) is present in relation to the first heat transfer material 22 in a volume range from about 0.1% to about 5%. In another embodiment, the high melting-point solder second heat transfer material 24 is present in relation to the first heat transfer material 22 in a volume range from about 0% to about 0.1%. In another embodiment, the high melting-point solder second heat transfer material 24 is present in relation to the first heat transfer material 22 in a volume range from about 0% to about 100%. In another embodiment, the high melting-point solder second heat transfer material 24 is present in relation to the first heat transfer material 22 in a volume range from about 2% to about 10%.

Another embodiment relates to packaging process embodiments 800 that includes bringing an integrated heat spreader and a die into TIM intermediary contact through an interface subsystem to achieve a BLT according to embodiments set forth herein.

Figure 8:
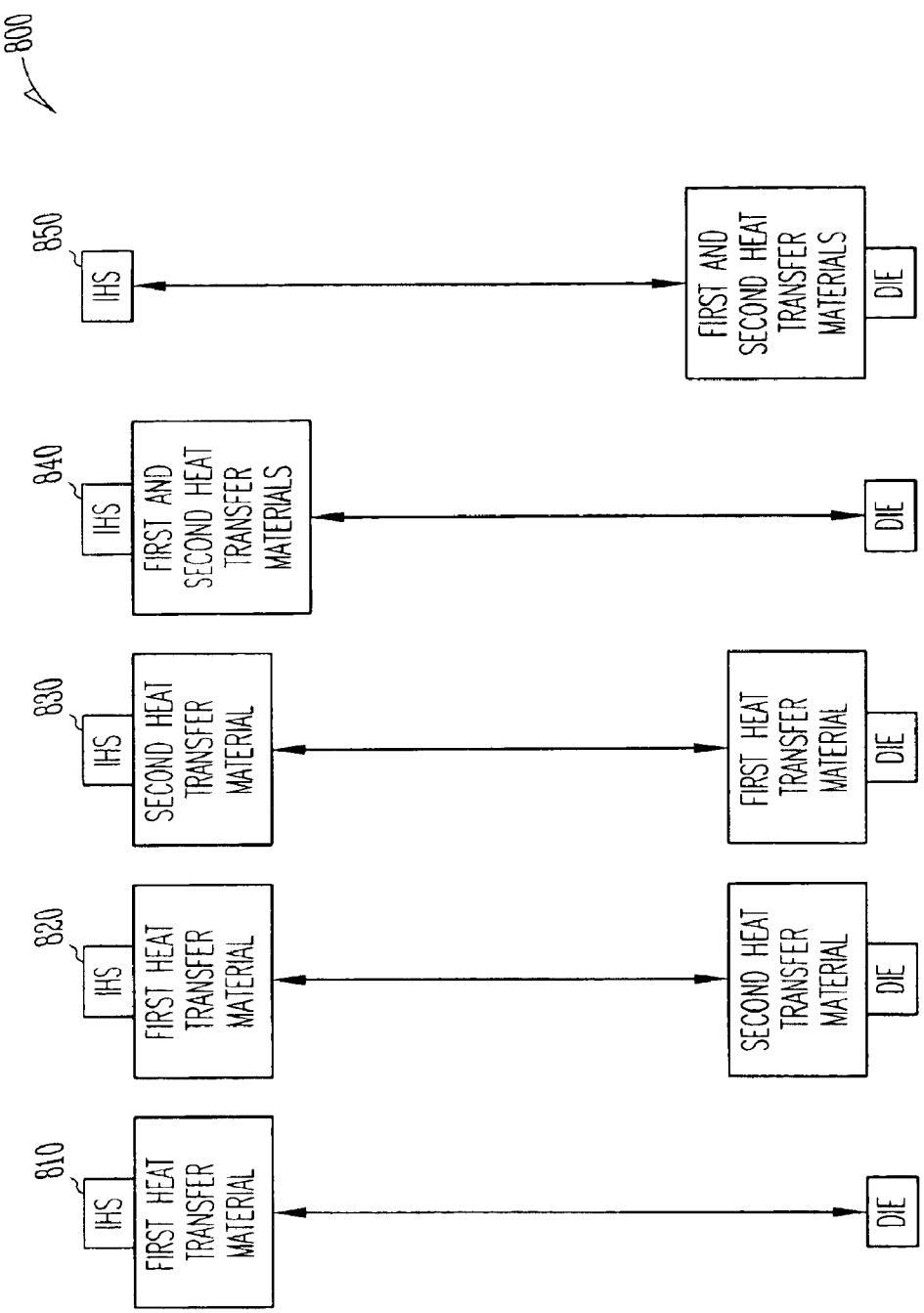
FIG. 8 is a process flow diagram that depicts non-limiting packaging process embodiments.

FIG. 8 is a process flow diagram that depicts non-limiting packaging process embodiments. According to the various process flow embodiments depicted in FIG. 8, the interface subsystem may be configured partially on the integrated heat spreader, partially on the die, entirely on the integrated heat spreader, or entirely on the die.

At 810, representing a first process flow embodiment, an integrated heat spreader (IHS) is contacted with a first heat transfer material, and the first heat transfer material is contacted with a die. The double-headed arrows in FIG. 8 indicate that the process flow may be in either direction. In other words, the first heat transfer material in one embodiment is disposed first against the integrated heat spreader, followed by disposition of the first heat transfer material against the die. Alternatively, the first heat transfer material in one embodiment is disposed first against the die, followed by disposition of the first heat transfer material against the integrated heat spreader.

At 820, representing a second process flow embodiment, an integrated heat spreader is contacted with a first heat transfer material. The first heat transfer material is contacted with a second heat transfer material that is disposed on a die. The double-headed arrows indicate alternative process flows as set forth above.

At 830, representing a third process flow embodiment, an integrated heat spreader is contacted with a second heat transfer material. The second heat transfer material is contacted with a first heat transfer material that is disposed on a die. The double-headed arrows indicate alternative process flows as set forth above.

At 840, representing a fourth process flow embodiment, an integrated heat spreader is contacted with combined first and second heat transfer materials. The combined first and second heat transfer materials are contacted with a die. The double-headed arrows indicate alternative process flows as set forth above. In another embodiment, the order of placing the first and second heat transfer materials onto the IHS is reversed.

At 850, representing a fifth process flow embodiment, a die is contacted with combined first and second heat transfer materials. The combined first and second heat transfer materials are contacted with a die. The double-headed arrows indicate alternative process flows as set forth above. In another embodiment, the order of placing the first and second heat transfer materials onto the die is reversed.

As depicted in the various process flow embodiments depicted in FIG. 8, it is noted that the die 12 (FIG. 1) is previously disposed upon a mounting substrate 26 (also FIG. 1). Further as depicted in FIG. 1, it is noted that an integrated heat spreader clip 38 is used to impart a pressure to the die-interface-heat spreader at least partially through a spring 40. Depending upon the combination of interface subsystem 20 and other factors such as adhesive gelling time, organic curing time, low melting-point reflow time, and others, the exact tension of the spring 40 is selected to the requirements of a given packaging system.

According to an embodiment, the bonding process of bringing an integrated heat spreader and a die into intermediary contact through an interface subsystem 20, 120, 220, 320, or 420 is referred to as a die-referenced process. The die-referenced process relates to the situation that the die 12 is already affixed upon the mounting substrate 26. And as in some embodiments, a second heat transfer material 24 is disposed between the integrated heat spreader 18 and the backside surface 16 of the die 12 while tensing the system with the spring 40. Accordingly, the variability in bonding thickness may often largely be in the bonding material 28 as it bridges the space between the lip 30 of the integrated heat spreader 18 and the mounting substrate 26.

In a general embodiment, after bringing the integrated heat spreader into intermediary contact with the die through the interface subsystem according to various embodiments, bonding the interface subsystem includes reflowing the low melting-point solder first heat transfer material, and/or curing an organic first heat transfer material. Additionally, where a second heat transfer material is disposed in a first heat transfer material, the solder reflowing process is carried out after bringing the structures together. Where the first heat transfer material is an organic material, a curing and/or hardening process is carried out after bringing the structures together. Where the first heat transfer material is an organic/inorganic composite, curing, hardening, and/or reflowing is carried out after bringing the structures together.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A packaging system comprising:
   a die including a backside surface;
   a thermal management device above the backside surface; and
   an interface subsystem between the backside surface and the thermal management device, wherein the interface subsystem includes:
      a first heat transfer material including an organic matrix;
      a second heat transfer material discretely disposed in the first heat transfer material, wherein the organic matrix has a lower curing temperature than the melting temperature of the second heat transfer material.

2. The packaging system according to claim 1, the system further including:
   at least one particle in the first heat transfer material, selected from a metal, an inorganic, and a combination thereof.

3. The packaging system according to claim 1, wherein the thermal management device is selected from an integrated heat spreader, a planar heat sink, a heat pipe, and combinations thereof.

4. The packaging system according to claim 1, wherein the second heat transfer material includes at least one solder island.

5. The packaging system according to claim 1, wherein the second heat transfer material includes a pattern of solder islands.

6. The packaging system according to claim 1, wherein the second heat transfer material includes a collection of solder islands, wherein the collection of solder islands have varying sizes, and wherein at least one larger solder island is above the die at an active region thereof.

7. The packaging system according to claim 1, wherein the first heat transfer material includes an organic-inorganic composite.

8. The packaging system according to claim 1, wherein the first heat transfer material further includes:
   an organic-inorganic composite including one of a polymer or a resin;
   optionally an inorganic dielectric; and
   optionally at least one metallic.

9. An integrated heat spreader system comprising:
   a heat spreader body having a recess;
   an interface subsystem in the recess, wherein the interface subsystem includes a second heat transfer material alone and discretely disposed within the recess, and wherein the second heat transfer material includes a discrete patterning within the recess;
   a die including a backside surface, wherein the backside surface is against the interface subsystem;
   the die including an active surface; and
   a substrate, wherein the active surface faces the substrate.

10. The integrated heat spreader system according to claim 9, further including:
    wherein the active surface communicates to the substrate through a plurality of electrical bumps; and
    a bonding material that adheres to the integrated heat spreader above the recess and to the substrate.

11. A die system comprising:
    a die including a backside surface;
    an interface subsystem on the backside surface, wherein the interface subsystem includes a second heat transfer material discretely disposed alone and on the backside surface and having a discrete patterning on the backside surface; and
    a substrate disposed below the die.

12. The die system according to claim 11, further including:
    a substrate below the die; and
    an integrated heat spreader above the die, wherein the interface subsystem is between the die and the integrated heat spreader.

13. A thermal interface comprising:
    a first heat transfer material, selected from a polymer, a polymer and a low melting point solder, a polymer and an inorganic dielectric, and a polymer and a low melting-point solder and an inorganic dielectric;
    a high melting-point solder second heat transfer material, discretely disposed within the first heat transfer material, wherein the high melting-point solder second heat transfer material has a higher thermal conductivity than the first heat transfer material; and
    a die including a backside surface, wherein the thermal interface is on the backside surface.

14. The thermal interface according to claim 13, further including:
    an integrated heat spreader, wherein the thermal interface is between the die and the integrated heat spreader.

* * * * *